Sept. 7, 1965 V. A. CAJAL ETAL 3,205,374

AVALANCHE TRANSISTOR NANOSECOND PULSE GENERATOR
WITH CHARGE STORAGE DIODE PROVIDING
FAST RISE-TIME PULSES

Filed Nov. 9, 1962

INVENTORS.
VICTOR A. CAJAL
FRANK J. POTTER

BY George W. Killian
AGENT

United States Patent Office 3,205,374
Patented Sept. 7, 1965

3,205,374
AVALANCHE TRANSISTOR NANOSECOND PULSE GENERATOR WITH CHARGE STORAGE DIODE PROVIDING FAST RISE-TIME PULSES

Victor A. Cajal, Rochester, and Frank J. Potter, Kenmore, N.Y., assignors to General Dynamics Corporation, Rochester, N.Y., a corporation of Delaware Filed Nov. 9, 1962, Ser. No. 236,662
4 Claims. (Cl. 307—88.5)

Figure 1:
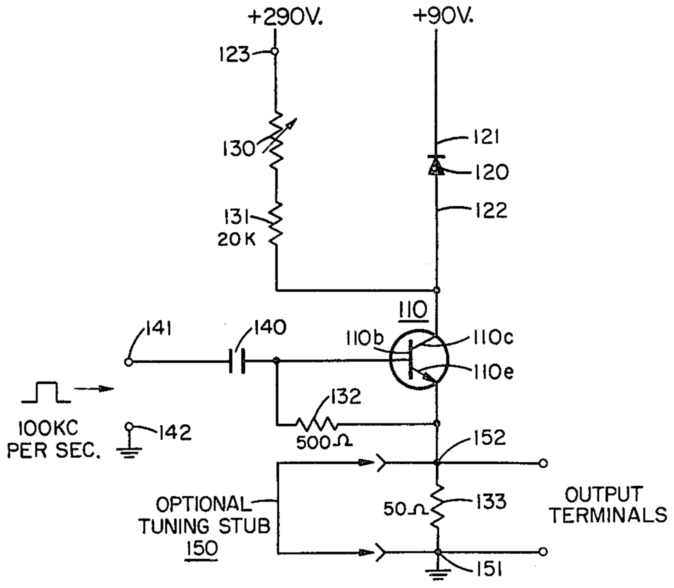

This invention relates in general to pulse generation and, more particularly, to the generation of pulses having a rise time of approximately two nanoseconds or less where one nanosecond equals one billionth of a second.

The invention herein disclosed is suitable for a variety of uses. For example, the invention may find utility in pulse repeaters, amplifiers, inverters, gate circuits, or any other application wherein pulses having a rapid rise time are required.

It is the general object of this invention to provide a new and improved pulse generator.

It is a more particular object of this invention to provide a new and improved pulse generator which produces output pulses which reach their peak amplitude in a very few nanoseconds.

It is another object of this invention to provide a new and improved pulse generator which can produce high amplitude pulses having a rise time of a few nanoseconds.

It is another object of this invention to provide a new and improved pulse generator wherein a stored charge is discharged through a transistor operating in the avalanche mode.

It is a more specific object of this invention to provide new and improved means for generating a pulse across a load impedance in the emitter-collector circuit of a transistor operating in the avalanche mode.

In accordance with the present invention, a transistor is so biased that operation takes place in the avalanche mode when the transistor is triggered to conduction by the application of a pulse to the base of the transistor. When the transistor is triggered, a stored charge is discharged through the emitter-collector circuit of the transistor and dissipated in a load resistor connected in series with the emitter-collector circuit. The stored charge may, of course, be obtained from a charged capacitor. However, in accordance with a preferred embodiment of this invention, the charge is derived from that stored in a semiconductor diode when it is in the forward conduction state. The amount of charge stored in the diode will depend upon the magnitude of the forward current and the charge acquiring ability of the diode. Techniques for determining dynamic characteristics of a diode including the charge acquiring ability of a diode are disclosed in Patent No. 2,931,980, issued on April 5, 1960, to F. J. Potter. For a given diode, the amount of stored charge may be conveniently controlled by connecting the diode in the circuit in such a manner that the forward current through the diode may be regulated. The stored charge together with the diode dynamic charactersitics and circuit parameters will determine the generated pulse width, and the amplitude of the generated pulse will be determined by the magnitude of the back potential applied to the diode, the load impedance, and diode characteristics. The time required to remove the stored charge from the diode is a function of the diode recovery resistance and of the circuit impedance, as explained in the cited patent. For operation of the transistor in the avalanche mode, the back potential will have to be greater than the avalanche potential but smaller than the breakdown potential. A tuning stub may be connected across the load resistor to shape and differentiate the generated pulse.

As will be seen, the use of a semiconductor as the charge storing device provides a generated pulse with a fast rise time because of the extremely fast switching action of the transistor when operated in the avalanche mode.

Further objects and advantages of the invention will become apparent as the following description proceeds, and features of novelty which characterize the invention will be pointed out in particularity in the claims annexed to and forming a part of this specification.

Figure 2:
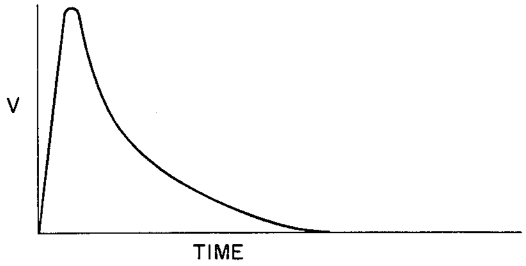
Figure 3:
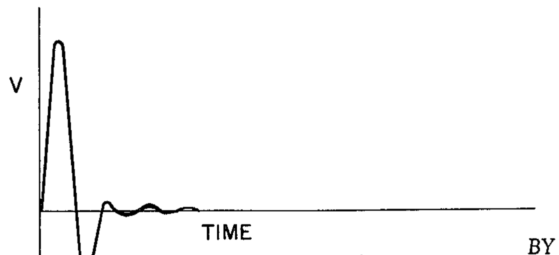

For a better understanding of the invention, reference may be had to the accompanying drawings which comprise three figures in which:

FIG. 1 shows the circuit details of a preferred embodiment of the invention; and FIGS. 2 and 3 illustrate various output pulses which may be obtained.

It is to be understood that only the details of the circuit necessary to understand the invention have been shown. For example, the circuit for generating the pulses to be applied to the base of the transistor is not shown as any of various suitable generators may be employed and the method of generating these pulses does not form a part of the present invention.

It is believed that the operation of the nanosecond pulse generator of this invention can best be understood when the above-identified figures are considered together with the following description.

FIG. 1 discloses a preferred embodiment of the invention. The collector electrode 110*c* and emitter electrode 110*e* of transistor 110 are connected in a series circuit including diode 120 and load impedance 133. Terminal 151 of the load impedance is connected to a ground, or reference, potential while the cathode 121 of diode 120 is connected to a potential which is positive with respect to ground and which has a magnitude between the avalanche and breakdown potentials of transistor 110. Although the illustrated transistor 110 is of the NPN type, it would be possible to substitute a PNP type transistor if suitable changes were made in the connections of the diode and the polarity of the power supplies.

A steady state current is caused to flow from the anode 122 to the cathode 121 of diode 120 since the power supply connected to point 123 is positive with respect to the power supply connected to point 121. The magnitude of the steady state current through diode 120 may be controlled by adjusting either the potential connected to terminal 123 and/or the variable resistor 130. Resistor 131 is included in the circuit to provide protection to diode 120 by limiting the maximum forward current therethrough.

As is well known to those skilled in the semiconductor art, a semiconductor diode acquires a charge of electricity during the operation in the conductive state, sometimes referred to as forward direction, and, also, such diodes have a certain amount of resistance to the discharge of the acquired charge when the diode is switched back from the conductive to the non-conductive state, i.e. from the forward to the reverse direction. A diode cannot be considered as completely switched from the forward to the reverse direction until the acquired charge is completely dissipated with reference to the circuit in which the diode may be operated. The resistance to discharge of the acquired charge will vary with each diode. The cited Potter patent teaches a simplified testing circuit for determining the charge acquiring ability of a diode and the resistance of the diode to the discharge of the acquired charge when the diode is switched to the reverse direction.

When a semiconductor diode is switched rapidly to the reverse direction in a low impedance circuit, the acquired charge is "swept out" rapidly.

The circuit of the preferred embodiment of the present invention utilizes the described characteristics of a semiconductor diode, together with the characteristics of a transistor operating in the avalanche mode to generate a pulse with a very rapid rise time.

The circuit parameters shown in FIG. 1 were found to be suitable when transistor 110 is of type 2N696 and the diode is of type 1N785.

As previously stated, the transistor 110 must be of the type which operates in the avalanche mode. Operation of a transistor in the avalanche mode results when the reverse biased silicon or germanium junctions breakdown as a result of a multiplicative process which is analogous to multiplicative breakdown in gas. Minority carriers, which are thermally or otherwise generated, diffuse to the high field region of the reverse biased junctions where they are accelerated, producing hole-electron pairs by collision with atoms of the crystal lattice. The rate of pair production is dependent upon the electric field distribution, and, in the case of semiconductors, holes and electrons are comparably effective in producing additional current carriers. The holes and electrons, which are produced by collision, may themselves produce additional pairs resulting in a cumulative increase or avalanche of current. The NPN transistor 110 may be triggered on by driving its base electrode **110*b* positive with respect to its emitter electrode 110*e*. When no current flows in resistor 133, the base 110*b* and emitter 110*e* are at the same potential, thereby inhibiting conduction. However, when a positive pulse is applied between terminals 141 and 142, a pulse is passed through capacitor 140 and the base 110*b* is raised to a positive potential with respect to the emitter, thereby triggering the transistor 110 into conduction. When the transistor 110 is triggered on, the charge stored in diode 120 is swept out and flows in the emitter-collector circuit of transistor 110 and through the load resistor 133 to ground at terminal 151**.

With transistor 110 turned on, the potential at point 122 is reduced to nearly ground potential with the result of rapidly switching the diode 120 from the forward to the reverse direction. Accordingly, the acquired charge is swept out of diode 120 at a rate determined in part by the dynamic characteristic of the diode 120 including the resistance of the diode to the discharge of the acquired charge.

The voltage pulse obtained when diode 120 discharges through transistor 110 may be taken across resistor 133 and displayed on an oscilloscope. The pulse width will be a function of the charge stored in the diode which, as previously mentioned, may be controlled by the forward current flowing through the diode and, of course, the dynamic characteristics of the diode. The amplitude of the pulse will be determined by the magnitude of the power supply connected to terminal 121 and by the impedance of the discharge loop consisting of diode 120, transistor 110, resistor 133, and the tuning stub 150, if connected. The 2N696 transistor used in one embodiment of the invention has an avalanche potential of fifty volts and a breakdown potential greater than ninety volts. Accordingly, in order to provide a maximum amplitude output pulse, the applied potential at point 121 was chosen to be ninety volts.

A typical curve of the potential pulse across the load resistor 133 when the tuning stub 150 is not connected is shown in FIG. 2. As may be seen, the tail of the pulse shows a long decay. The long tail may be eliminated by connecting a shorted tuning stub 150 in parallel with the load resistor 133. For the illustrated embodiment of the invention, a tuning stub comprising a piece of fifty ohm coaxial cable, fifteen centimeters long, was connected in parallel with the load resistor 133 and the other end of the tuning stub was shorted. The frequency for which this tuning stub may be shown to be one-quarter wave length long is five hundred megacycles per second. That is $$\lambda=\frac{2\pi V}{\omega}$$

where $V$=the velocity of propagation which, as a first approximation, may be assumed to be the velocity of light or $2.998\times10^{10}$ centimeters per second.

$\omega=2\pi f$, and $f$=frequency in cycles per second.

Accordingly:

$$\lambda=\frac{2\pi V}{2\pi f}=\frac{V}{f}$$

or $$f=\frac{V}{\lambda}$$

Therefore, the frequency for which the fifteen centimeter line is a quarter wave length is:

$$f=2.998\times\frac{10^{10}}{2\times15}=500\times10^{6}\text{ c.p.s.}$$

For a $500=10^6$ c.p.s wave, each cycle has a period of two nanoseconds. Accordingly, when the one-quarter wave length shorted stub is connected in parallel with load resistor 133, any voltage pulse generated across load resistor 133 will be differentiated into a two nanosecond pulse which may be presumed to have a one nanosecond rise time and a one nanosecond decay. It should be noted that the connection of the shorted one-quarter wave length stub does not alter the impedance of the load between terminals 151 and 152. This is because the impedance looking into a one-quarter wave length line is given by the equation $$Z_{in}=\frac{Z_0^2}{Z_t}$$

where $Z_0$=the characteristic impedance of the line, and $Z_t$=the terminating impedance, which is zero for a shorted stub.

Accordingly, the impedance of the stub may be seen to approach infinity.

FIG. 3 illustrates the shape of the voltage wave across the impedance 133 when the tuning stub 150 is connected. The tuning stub reduces the amplitude of the output pulse because of its differentiating action. As may be seen, the tail of FIG. 2 is eliminated and a lower amplitude negative pulse is included as the tuning stub causes the trailing edge of the pulse to be differentiated. The rise and fall time of the two peaks in FIG. 3 are approximately one nanosecond each.

The use of the diode 120 as the medium for storing the charge allows the use of convenient circuit means for varying the stored charge and thereby varying the rise time and amplitude of the output pulse. In addition, the diode acts as a battery in that a small constant voltage is maintained across it. The voltage across the load is $$e_0=I_pR_l$$

where $I_p$=peak current, and $R_l$=load.

The peak current is given by the equation:

$$I_p=\frac{V_s-V_a}{R_l+R_d}$$

where $V_s$=supply voltage=90 v., $V_a$=avalanche voltage=50 v., $R_l$=load=50 ohms, and $R_d$=25 ohms, the dynamic recovery resistance of the diode as defined in the cited Potter patent.

For the illustrated components, $e_0$ was found to be 26.6 v.

The use of the diode in the present invention permits the storage of a smaller and more easily controlled magnitude of charge than would be possible with capacitors.

While there has been shown and described what is considered at present to be the preferred embodiment of the invention, modifications thereto will readily occur to those skilled in the art. It is not desired, therefore, that the invention be limited to the embodiment shown and described, and it is intended to cover in the appended claims all such modifications as fall within the true spirit and scope of the invention.

What is claimed is:

1. A pulse repeater comprising respective first, second and third points of fixed potential, a junction point, first resistance means having one end thereof connected to said first point of fixed potential and the other end thereof connected to said junction point, a semiconductor diode having one end thereof connected to said junction point and the other end thereof connected to said second point of fixed potential, said second point of fixed potential having a polarity and magnitude with respect to said first point of fixed potential to forwardly bias said diode, whereby a normal forward current flows through said diode which has a magnitude which is determined by the potential difference between said first and second points of fixed potential and the value of said first resistance, a transistor having a collector, an emitter and base which is capable of operating in the avalanche mode, a second resistance, means for connecting the collector-emitter path of said transistor in series with said second resistance between said junction point and said third point of fixed potential, said third point of fixed potential having a polarity and magnitude with respect to each of said first and second points of fixed potential to permit said transistor to operate in its avalanche mode in response to a trigger pulse being applied between the emitter and base thereof and to effect the reverse biasing of said diode in response to the initiation of said transistor operating in its avalanche mode, and means for applying a trigger pulse between the base and emitter of said transistor.

2. The pulse repeater defined in claim 1, wherein the collector of said transistor is connected directly to said junction point and said second resistance is connected between the emitter of said transistor and said third point of fixed potential, and means for applying the signal derived across said second resistance as an output from said repeater.

3. The pulse repeater defined in claim 2 further including a tuning stub connected in parallel with said second resistance.

4. The pulse repeater defined in claim 1, wherein said first resistance is adjustable, whereby the magnitude of said forward current through said diode may be varied.

References Cited by the Examiner

"A Study of High-Speed Avalanche Transistors," by Beale, Stephenson and Wolfendale in Proceedings of the IEE, vol. 104, No. B–16, dated July 1957, pages 394–402 and FIG. 15 are pertinent.

"Avalanche Transistor Circuits" in The Review of Scientific Instruments, dated November 1961, pages 1198–1202 and FIG. 2 are pertinent.

"Proceedings of IRE," dated June 1961, page 1093 and FIG. 2 relied on.

ARTHUR GAUSS, *Primary Examiner.*